US012567560B2

(12) United States Patent
Cook et al.

(10) Patent No.: US 12,567,560 B2
(45) Date of Patent: Mar. 3, 2026

(54) DISTORTION REDUCTION IN A MULTI-BEAM IMAGING SYSTEM

(71) Applicant: KLA Corporation, Milpitas, CA (US)

(72) Inventors: Michael I. Cook, Milpitas, CA (US); Sameet K. Shriyan, San Jose, CA (US); David Dowling, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 536 days.

(21) Appl. No.: 17/955,252

(22) Filed: Sep. 28, 2022

(65) Prior Publication Data

US 2024/0112884 A1    Apr. 4, 2024

(51) Int. Cl.
 *H01J 37/317*        (2006.01)
 *H01J 37/153*        (2006.01)
 *H01J 37/244*        (2006.01)

(52) U.S. Cl.
 CPC ........ *H01J 37/3177* (2013.01); *H01J 37/153* (2013.01); *H01J 37/244* (2013.01)

(58) Field of Classification Search
 CPC .... H01J 37/3177; H01J 37/153; H01J 37/244; H01J 2237/153; H01J 2237/24514; H01J 2237/2485; H01J 37/265
 See application file for complete search history.

(56) References Cited

U.S. PATENT DOCUMENTS 5,973,332 A * 10/1999 Muraki .................. B82Y 10/00
                                        250/398
6,630,681 B1 * 10/2003 Kojima .................. B82Y 40/00
                                        430/30

10,224,172 B2 * 3/2019 Ogasawara ........... H01J 37/244
10,607,811 B1 * 3/2020 Mohammadi-Gheidari ................
                                                H01J 37/263
2002/0000766 A1 * 1/2002 Ono ........................ H01J 37/12
                                                313/240

(Continued)

FOREIGN PATENT DOCUMENTS

EP        3813091 A1     4/2021

OTHER PUBLICATIONS

Korean Intellectual Property Office, International Search Report and Written Opinion for International Application No. PCT/US2023/032812, Jan. 2, 2024, 10 pages.

(Continued)

*Primary Examiner* — David A Vanore
(74) *Attorney, Agent, or Firm* — Suiter Swantz IP

(57)                    ABSTRACT

A system may include a controller couplable to an imaging sub-system utilizing multiple particle beams, where the imaging sub-system includes one or more control elements to manipulate the two or more particle beams that are adjustable with two or more control parameters. The controller may select values of the two or more control parameters by iteratively performing steps until one or more termination conditions are met. For example, the controller may receive measurements of changes of distortions of the particle beams resulting from individual adjustments of the control parameters. The controller may further calculate values of the control parameters that reduce the distortions of the particle beams based on the changes of the distortions resulting from the individual adjustments. The controller may further direct the adjustment of the values of the control parameters to the calculated values.

19 Claims, 5 Drawing Sheets

(56)                  References Cited

U.S. PATENT DOCUMENTS

| | | | | |
|---|---|---|---|---|
| 2002/0148961 A1* | 10/2002 | Nakasuji | ............ | G01N 23/2251 |
| | | | | 250/311 |
| 2003/0122076 A1* | 7/2003 | Matsuya | ............... | H01J 37/153 |
| | | | | 250/311 |
| 2004/0100629 A1* | 5/2004 | Stokowski | ......... | G01M 11/0264 |
| | | | | 356/237.2 |
| 2005/0023486 A1* | 2/2005 | Takakuwa | ........... | H01J 37/3174 |
| | | | | 250/492.2 |
| 2006/0255269 A1* | 11/2006 | Kawasaki | ............. | H01J 37/153 |
| | | | | 250/310 |
| 2008/0078943 A1* | 4/2008 | Kawai | ................. | H01J 37/1471 |
| | | | | 250/397 |
| 2010/0224781 A1* | 9/2010 | Hosokawa | ........... | H01J 37/153 |
| | | | | 250/311 |
| 2011/0139980 A1* | 6/2011 | Nakano | ................... | H01J 37/26 |
| | | | | 250/307 |
| 2011/0272576 A1* | 11/2011 | Otaki | ..................... | B82Y 40/00 |
| | | | | 250/306 |
| 2013/0068949 A1* | 3/2013 | Urano | ................... | H01J 37/265 |
| | | | | 250/310 |
| 2013/0320230 A1* | 12/2013 | Yoshikawa | ......... | H01J 37/3177 |
| | | | | 250/398 |
| 2015/0060654 A1* | 3/2015 | Urano | .................... | H01J 37/28 |
| | | | | 250/252.1 |
| 2019/0214222 A1* | 7/2019 | Urano | ................... | H01J 37/244 |
| 2020/0152412 A1* | 5/2020 | Ren | ..................... | H01J 37/1474 |
| 2022/0005667 A1* | 1/2022 | Tamaki | ................. | H01J 37/153 |

OTHER PUBLICATIONS

Rudnaya et al., "Derivative-free optimization for autofocus and astigmatism correction in electron microscopy," International Conference on Engineering Optimization, Sep. 6-9, 2010, Lisbon, Portugal, 10 pages.

* cited by examiner

300

302 — DIRECTING TWO OR MORE PARTICLE BEAMS TO A SAMPLE PLANE WITH AN IMAGING SYSTEM INCLUDING AT LEAST ONE OR MORE CONTROL ELEMENTS, WHERE THE ONE OR MORE CONTROL ELEMENTS ARE CONFIGURABLE WITH TWO OR MORE CONTROL PARAMETERS

304 — SELECTING VALUES OF THE TWO OR MORE CONTROL PARAMETERS

304

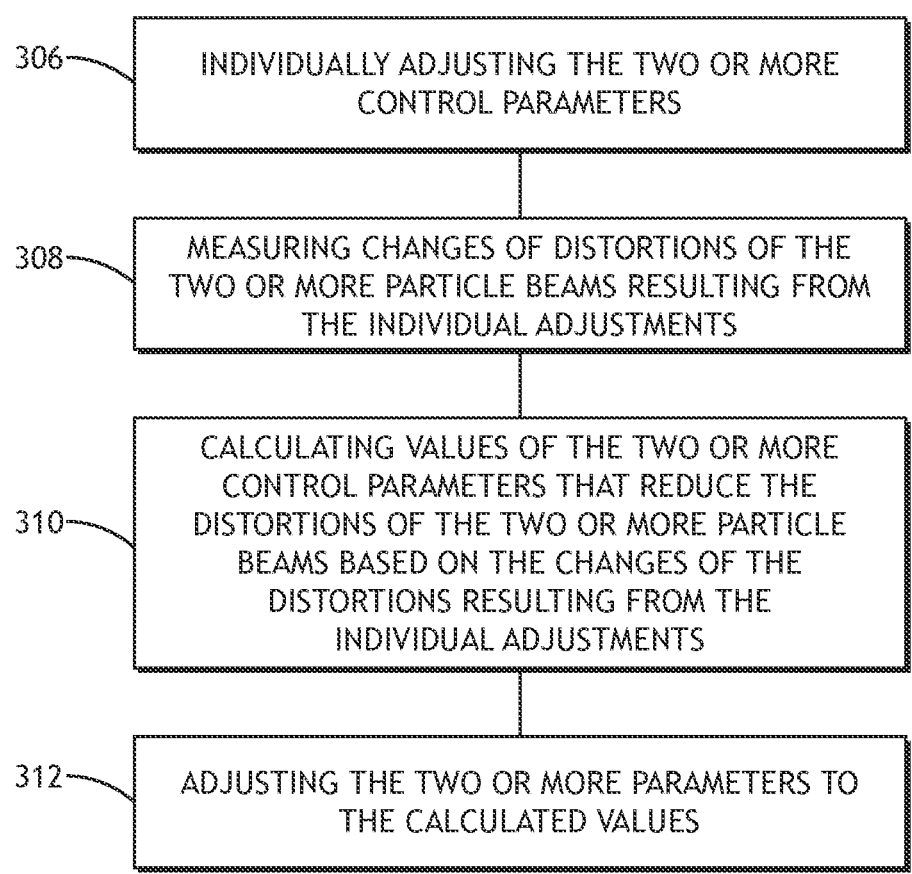

306 — INDIVIDUALLY ADJUSTING THE TWO OR MORE CONTROL PARAMETERS

308 — MEASURING CHANGES OF DISTORTIONS OF THE TWO OR MORE PARTICLE BEAMS RESULTING FROM THE INDIVIDUAL ADJUSTMENTS

310 — CALCULATING VALUES OF THE TWO OR MORE CONTROL PARAMETERS THAT REDUCE THE DISTORTIONS OF THE TWO OR MORE PARTICLE BEAMS BASED ON THE CHANGES OF THE DISTORTIONS RESULTING FROM THE INDIVIDUAL ADJUSTMENTS

312 — ADJUSTING THE TWO OR MORE PARAMETERS TO THE CALCULATED VALUES

FIG.3B

DISTORTION REDUCTION IN A MULTI-BEAM IMAGING SYSTEM

The present disclosure relates generally to imaging with multiple particle beams and, more particularly, to distortion reduction in imaging with multiple particle beams.

BACKGROUND

Particle beam imaging systems typically generate images by illuminating the sample with one or more particle beams such as, but not limited to, electron beams. Multi-beam systems may generate parallel images of different regions of the sample using simultaneous illumination of the sample with multiple particle beams. However, control of the distortion of the multiple particle beams is difficult due to the number of beams and because the effects of adjustments typically are coupled to multiple beams. There is therefore a need to develop systems and methods to address the above deficiencies.

SUMMARY

A system is disclosed in accordance with one or more illustrative embodiments of the present disclosure. In one illustrative embodiment, the system includes a controller couplable with an imaging sub-system utilizing multiple particle beams, where the imaging sub-system includes one or more control elements to manipulate the two or more particle beams, and where the one or more control elements are adjustable with two or more control parameters. In another illustrative embodiment, the controller selects values of the two or more control parameters by iteratively receiving measurements of changes of distortions of the two or more particle beams resulting from individual adjustments of the two or more control parameters, calculating values of the two or more control parameters that reduce the distortions of the two or more particle beams based on the changes of the distortions resulting from the individual adjustments, and directing the adjustment of the values of the two or more control parameters to the calculated values.

A system is disclosed in accordance with one or more illustrative embodiments of the present disclosure. In one illustrative embodiment, the system includes an imaging sub-system utilizing multiple particle beams, where the imaging sub-system includes one or more control elements to manipulate the two or more particle beams, and where the one or more control elements are adjustable with two or more control parameters. In another illustrative embodiment, the system includes a controller. In another illustrative embodiment, the controller selects values of the two or more control parameters by iteratively receiving measurements of changes of distortions of the two or more particle beams resulting from individual adjustments of the two or more control parameters, calculating values of the two or more control parameters that reduce the distortions of the two or more particle beams based on the changes of the distortions resulting from the individual adjustments, and directing the adjustment of the values of the two or more control parameters to the calculated values.

A method is disclosed in accordance with one or more illustrative embodiments of the present disclosure. In one illustrative embodiment, the method includes directing two or more particle beams to a sample plane with an imaging system including at least one or more control elements for manipulating the two or more particle beams, where the one or more control elements are configurable with two or more control parameters. In another illustrative embodiment, the method includes selecting values of the two or more control parameters by iteratively individually adjusting the two or more control parameters and measuring changes of distortions of the two or more particle beams resulting from the individual adjustments, calculating values of the two or more control parameters that reduce the distortions of the two or more particle beams based on the changes of the distortions resulting from the individual adjustments, and adjusting the two or more control elements to the calculated values.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 3B is a flow diagram illustrating a series of steps for selecting values of the two or more control parameters, in accordance with one or more embodiments of the present disclosure.

DETAILED DESCRIPTION

Figure 1A:
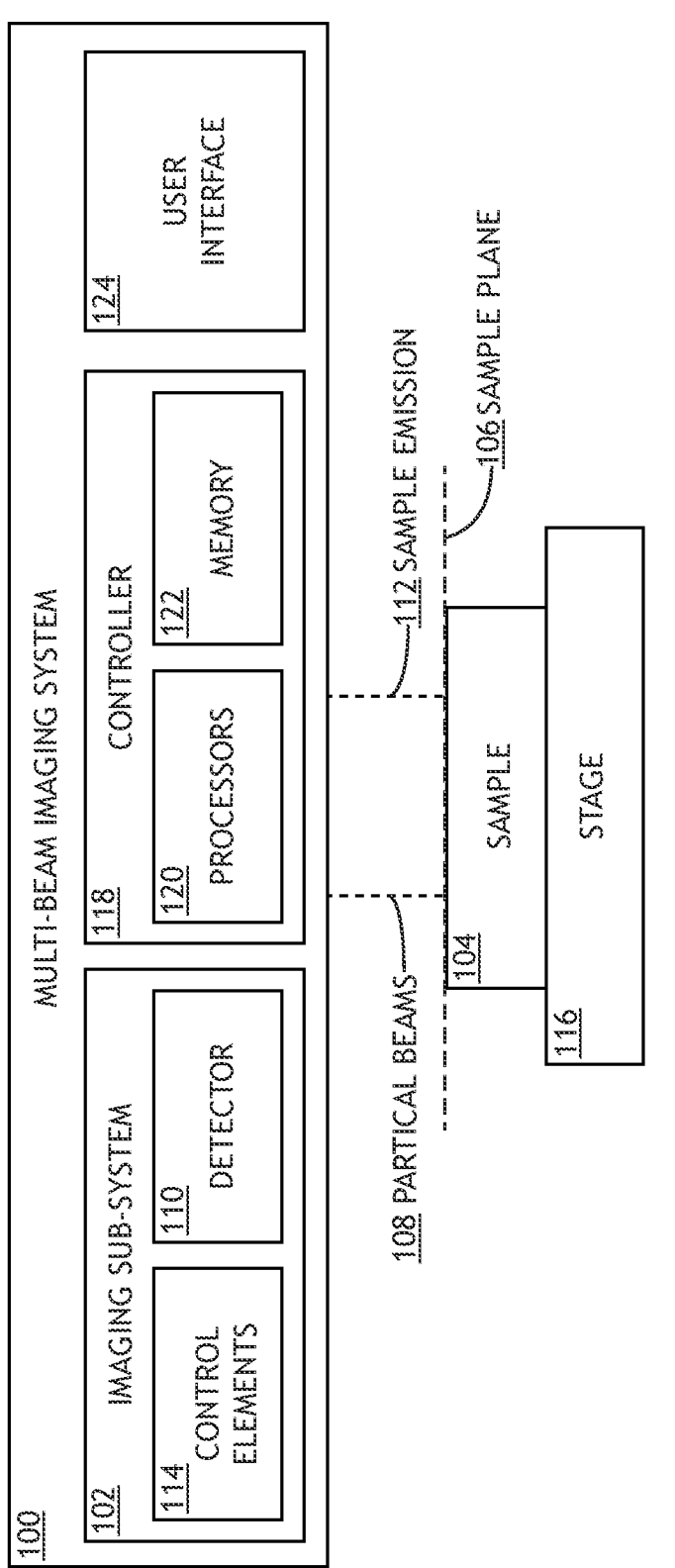
FIG. 1A is a block diagram of a multi-beam imaging system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for distortion control of multiple particle beams in a multi-beam imaging system, where the distortions may be associated with positions and/or aberrations of the two or more particle beams.

A particle beam may include any type of particles including, but not limited to, electrons (e.g., an electron beam, an e-beam, or the like), ions, or neutral particles. A multi-beam imaging system may simultaneously direct multiple particle beams to a sample plane to facilitate parallel images of multiple locations of a sample at the sample plane. Such a system may further include various control elements to manipulate the particle beams such as, but not limited to, lenses, rotators, magnifiers, or stigmators (e.g., astigmatism correctors). For example, the control elements may be used to provide a desired distribution of the particle beams in the sample plane and/or control various characteristics of the particle beams (e.g., focused spot size, beam shape, or the like). A control element may have one or more control parameters that may be used to configure the performance of the element and thus to configure the properties of the particle beams. As an illustration, control parameters of a control element may include, but are not limited to, a position of the control element, an orientation of the control element (e.g., a rotation, or the like), or a focusing power.

It is typically desirable to reduce, minimize, eliminate, or otherwise control distortions of the particle beams, particularly at the sample plane. Such distortions may thus relate to aberrations of the individual particle beams and/or deviations of the positions of the particle beams in the sample plane from designed positions.

However, it is contemplated herein that simultaneous distortion reduction of multiple particle beams presents various challenges. For example, an adjustment of a control parameter (e.g., of a control element) may have a non-uniform impact on the particle beams. As an illustration, particle beams near a center of a distribution may be impacted differently than particle beams near an edge of the distribution due to off-axis aberrations or other effects. As another example, a multi-beam imaging system may have multiple control parameters associated with one or more control elements, where the effects of at least some control parameter adjustments are coupled. Additionally, the system complexity as well as computational requirements increase as the number of particle beams in a system is increased. In a general sense, a multi-beam imaging system may have any number of beams including, but not limited to, tens or hundreds of beams.

It is further contemplated herein that the simultaneous distortion reduction of multiple particle beams may be efficiently achieved through linear predictive modeling of the impact of individual control parameter adjustments. For example, distortion control may be provided by individually adjusting two or more control parameters that impact the particle beams, measuring changes of distortions of the two or more particle beams resulting from the individual adjustments, and calculating values of the two or more control parameters that reduce the distortions of the two or more particle beams based on the changes of the distortions resulting from the individual adjustments. These steps may then be repeated (e.g., iterated) until the one or more termination conditions are met (e.g., absolute distortion thresholds, a minimum change in calculated values between successive iterations, a maximum number of iterations, or the like).

Various techniques may be used to calculate the control parameters that reduce distortions in any of the iterations. In embodiments, it is assumed that the distortion of each particle beam varies linearly with each control parameter adjustment such that the measured changes of distortions in response to a control parameter adjustment correspond to proportionality constants in a linear predictive model. Subsequently, a minimization technique may be applied to the linear predictive model to determine values of control parameters that may reduce distortions across the set of particle beams. In this way, the minimization technique may identify a local or absolute minimum of the linear predictive model which may correspond to values of control parameters providing reduced distortion relative to current values. Iteration of this process may then result in a convergence to values of the control parameters that satisfy termination conditions for a particular application.

The terms "minimize," "minimization," "optimize," or "optimization" are used herein to refer to determining acceptable values from a set of alternatives. It is not necessary that such a minimization or optimization provide a singular "best" result. Rather, any acceptable result within selected performance criteria (e.g., tolerances) is within the spirit and scope of the present disclosure. For example, a linear predictive model as described herein may relate adjustments to various control parameters of a multi-beam imaging system to distortion of a set of particle beams. The application of a minimization technique to such a model may thus identify control parameter values that at least reduce the distortion and, in some cases, may identify a local or absolute minimum. In a general sense, any type of minimization or optimization technique may be used such as, but not limited to, iterative or heuristic techniques.

It is contemplated herein that distortion control based on linear predictive modeling as disclosed herein may facilitate efficient simultaneous minimization of the distortion of a set of particle beams in a multi-beam imaging system and may further provide improved accuracy over techniques in which each control parameter is optimized (e.g., minimized) in turn. In particular, finding a minimum of a multidimensional function by iteratively minimizing over each parameter in turn is in general inefficient. As an illustration, for a long narrow minimum with principal axes that don't coincide with the parameter axes, each parameter minimization may go across the valley rather than along the valley. The techniques disclosed herein may thus facilitate superior distortion control with higher accuracy for a given time or number of iterations than alternative techniques.

Additional efficiency improvements may be made by performing distortion correction first for a subset of the particle beams (e.g., as a coarse distortion correction) followed by distortion correction for the entire set of particle beams (e.g., a fine distortion correction). In this way, the coarse correction may reduce the complexity of the linear predictive model as well as the required computational time and resources. The fine distortion correction may then efficiently provide precise correction for all beams.

Referring now to FIGS. 1A-3B, systems and methods for distortion correction of multiple particle beams is described in greater detail, in accordance with one or more embodiments of the present disclosure.

FIG. 1A is a block diagram of a multi-beam imaging system 100, in accordance with one or more embodiments of the present disclosure.

In embodiments, the multi-beam imaging system 100 includes an imaging sub-system 102 to illuminate a sample 104 (or a sample plane 106 more generally) with two or more particle beams 108 and at least one detector 110 to collect sample emission 112 from the sample 104 in response to the illumination.

In embodiments, the imaging sub-system 102 includes one or more control elements 114 suitable for manipulating the particle beams 108. For example, the control elements 114 may control or otherwise impact parameters of the particle beams 108 such as, but not limited to, beam profiles, spot sizes, or aberrations. As another example, the control elements 114 may control or otherwise impact a distribution of the particle beams 108 at the sample plane 106 (e.g., relative positions of the particle beams 108, an orientation of a pattern of the particle beams 108, or the like).

Figure 2:
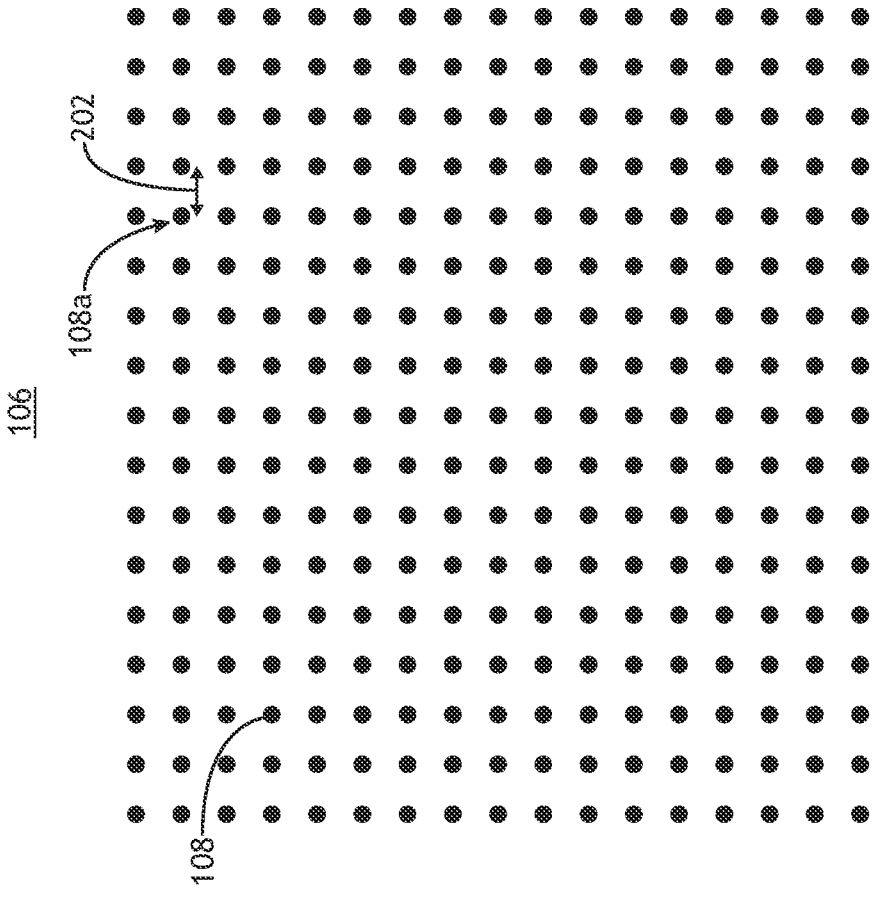
FIG. 2 is a top view of the sample plane depicting a square distribution of particle beams, in accordance with one or more embodiments of the present disclosure.

The imaging sub-system 102 may provide any distribution of particle beams 108 at the sample plane 106. As a non-limiting illustration, FIG. 2 is a top view of the sample plane 106 depicting a square distribution of particle beams 108, in accordance with one or more embodiments of the present disclosure.

In embodiments, the imaging sub-system 102 further includes a stage 116 to secure and/or position the sample 104 at the sample plane 106.

In embodiments, the multi-beam imaging system 100 further includes a controller 118 communicatively coupled to any components therein. In some embodiments, the controller 118 includes one or more processors 120. For example, the one or more processors 120 may be configured to execute a set of program instructions maintained in a memory 122, or memory device. The one or more processors 120 of a controller 118 may include any processing element known in the art. In this sense, the one or more processors 120 may include any microprocessor-type device configured to execute algorithms and/or instructions.

The one or more processors 120 of a controller 118 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FP-GAs), or one or more digital signal processors (DSPs)). In this sense, the one or more processors 120 may include any device configured to execute algorithms and/or instructions (e.g., program instructions stored in memory). In some embodiments, the one or more processors 120 may be embodied as a desktop computer, mainframe computer system, workstation, image computer, parallel processor, networked computer, or any other computer system config-ured to execute a program configured to operate or operate in conjunction with the multi-beam imaging system 100, as described throughout the present disclosure. Moreover, dif-ferent subsystems of the multi-beam imaging system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 118 may include one or more controllers housed in a common housing or within multiple housings. In this way, any controller or combina-tion of controllers may be separately packaged as a module suitable for integration into the multi-beam imaging system 100.

The memory 122 may include any storage medium known in the art suitable for storing program instructions execut-able by the associated one or more processors 120. For example, the memory 122 may include a non-transitory memory medium. By way of another example, the memory 122 may include, but is not limited to, a read-only memory (ROM), a random-access memory (RAM), a magnetic or optical memory device (e.g., disk), a magnetic tape, a solid-state drive and the like. It is further noted that the memory 122 may be housed in a common controller housing with the one or more processors 120. In some embodiments, the memory 122 may be located remotely with respect to the physical location of the one or more processors 120 and the controller 118. For instance, the one or more processors 120 of the controller 118 may access a remote memory (e.g., server), accessible through a network (e.g., internet, intranet, and the like).

The controller 118 may direct (e.g., through control signals) and/or receive data from any components or sub-systems of the multi-beam imaging system 100 such as, but not limited to, the detector 110 or the control elements 114. The controller 118 may further be configured to perform any of the various process steps described throughout the present disclosure.

In embodiments, the multi-beam imaging system 100 includes a user interface 124 communicatively coupled to the controller 118. In one embodiment, the user interface 124 may include, but is not limited to, one or more desktops, laptops, tablets, and the like. In another embodiment, the user interface 124 includes a display used to display data of the multi-beam imaging system 100 to a user. The display of the user interface 124 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 124 is suitable for implementation in the present disclosure. In another embodiment, a user may input selections and/or instructions responsive to data displayed to the user via a user input device of the user interface 124.

Figure 1B:
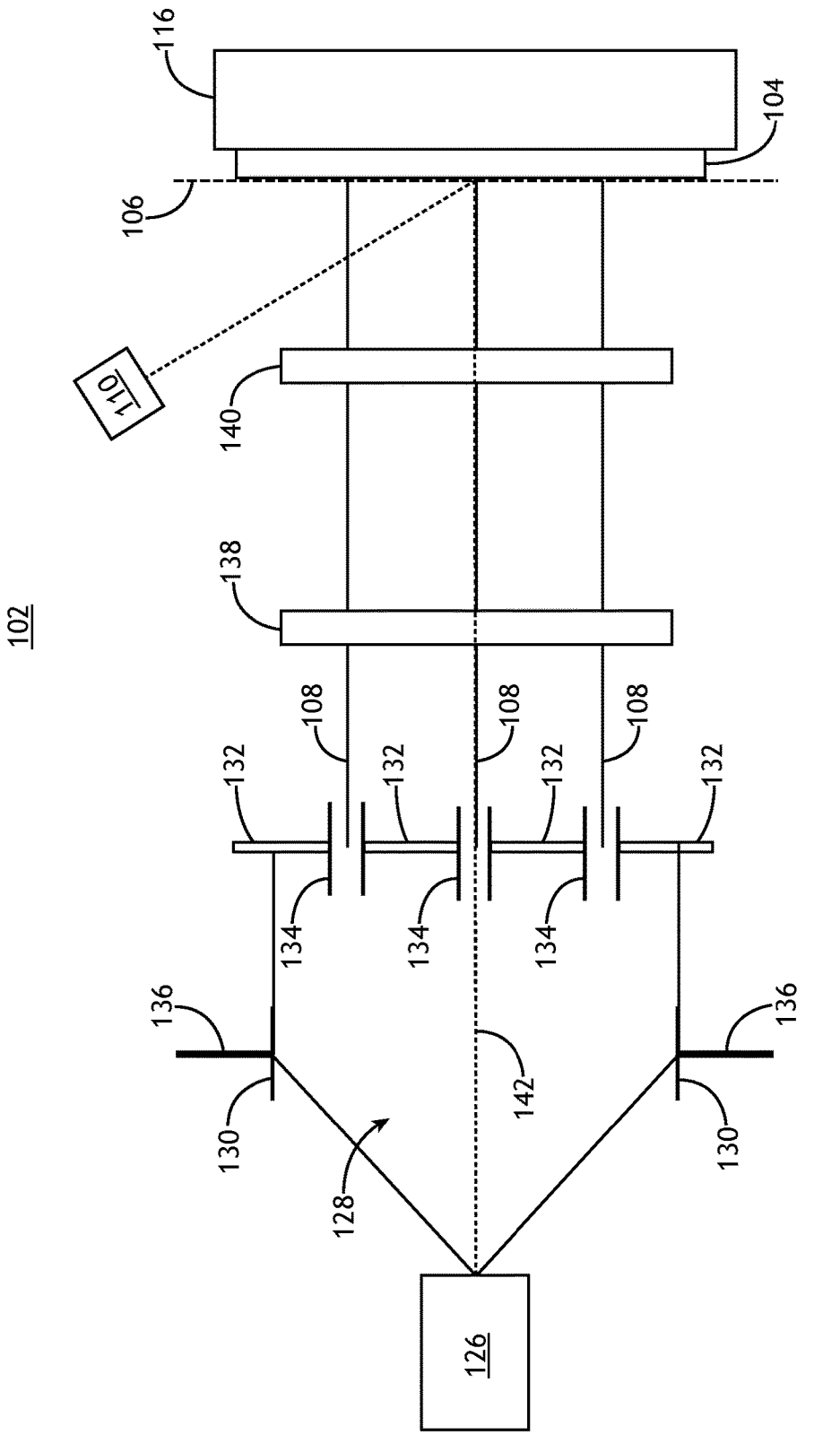
FIG. 1B is a conceptual view of an imaging sub-system, in accordance with one or more embodiments of the present disclosure.

FIG. 1B is a conceptual view of the imaging sub-system 102, in accordance with one or more embodiments of the present disclosure.

The imaging sub-system 102 may include any combina-tion of elements suitable for generating two or more particle beams 108, which may include any type of particles such as, but not limited to, electrons, ions, or neutral particles.

In embodiments, the imaging sub-system 102 includes a particle source 126 to generate particle emission 128 and a gun lens 130 to collect, collimate, and/or focus the particle emission 128. The particle source 126 may include any type of gun or emitter known in the art including, but not limited to, a thermal field emission (TFE) source. The imaging sub-system 102 may further include one or more compo-nents to split the particle emission 128 into multiple particle beams 108 such as, but not limited a micro-aperture array 132 or a micro-lens array 134. The imaging sub-system 102 may also include a beam-limiting aperture 136 to control a spatial extent of the particle emission 128 that may contrib-ute to the generation of particle beams 108.

FIG. 1B further conceptually depicts various control elements 114 to manipulate the particle beams 108 and/or direct the particle beams 108 to the sample plane 106 for interaction with a sample 104. For example, the control elements 114 may include one or more beam shape correc-tors 138 such as, but not limited to, stigmators or other aberration-control elements. As an illustration, the beam shape correctors 138 may include a one or more multi-pole correctors (e.g., multi-pole aberration correctors) such as, but not limited to, quadrupole correctors or hexapole cor-rectors. As another illustration, the beam shape correctors 138 may include a corrector array (e.g., a stigmator array, or the like). By way of another example, the control elements 114 may include one or more lenses 140 such as, but not limited to, one or more transfer lenses or an objective lens. The lenses 140 may include any type of element suitable for manipulating the focus of at least one particle beam 108 such as, but not limited to, electrostatic lenses, magnetic lenses, uni-potential lenses, or double-potential lenses. The lenses 140 may thus control focused spot sizes of each of the particle beams 108 as well as a magnification of the pattern of particle beams 108 provided by the micro-aperture array 132 and/or the micro-lens array 134 (e.g., the spacing between the particle beams 108). Additionally, although not explicitly illustrated, the control elements 114 may include one or more rotators to control an orientation (e.g., a rotation angle) of the pattern of particle beams 108 in the sample plane 106.

The operation of the control elements 114, alone or in combination, may be adjusted via one or more control parameters, which may be considered as settings of the imaging sub-system 102. The control parameters may include any type of setting that is adjustable (e.g., by a user). For example, the control parameters may include a position of a control element 114 in any direction such as along an illumination axis 142 or within a plane orthogonal to the illumination axis 142. As another example, the control parameters may include a focusing power of a control element 114 (e.g., of any of the lenses 140). As another example, the control parameters may include a current and/or a voltage applied to a control element 114, which may impact a magnitude of an impact on the particle beams 108. As an illustration, current and/or voltage adjustments may impact the focusing power of lenses 140, the amount of aberration correction provided by a stigmator, or the like.

In embodiments, the imaging sub-system 102 is configured to simultaneously and independently scan each of the particle beams 108 in the sample plane 106 using any suitable elements such as, but not limited to, a micro-lens array 134 or other elements within paths of individual particle beams 108.

In embodiments, the imaging sub-system 102 includes at least one detector 110, which may be used for a variety of purposes. For example, a detector 110 may be used to capture sample emission 112 in response to illumination with the particle beams 108. Signals provided by the detector 110 may then be used (e.g., by the controller 118) to generate images. The detector 110 may then generate independent signals associated with sample emission 112 from locations illuminated by each of the particle beams 108. As another example, a detector 110 may be used to measure distortions of the particle beams 108 or changes of the distortions in response to adjustments of control parameters.

The detector 110 may include any type of sensor known in the art. For example, the detector 110 may include a particle sensor (e.g., a secondary electron sensor, a backscattered electron sensor, or the like). As another example, the detector 110 may include a photon sensor (e.g., a photodetector, an x-ray detector, a scintillating element coupled to photomultiplier tube (PMT) detector, or the like) for detecting photons from the sample surface. As an illustration, FIG. 1B depicts a detector 110 arranged to capture secondary electrons emitted from the sample 104. It is noted that FIG. 1B depicts the sample emission 112 as a straight dashed line for illustrative purposes. However, it is to be understood that the sample emission 112 may take any path to the detector 110. For example, the sample emission 112 may be collected by a lens 140 and directed to the detector 110.

Figure 3A:
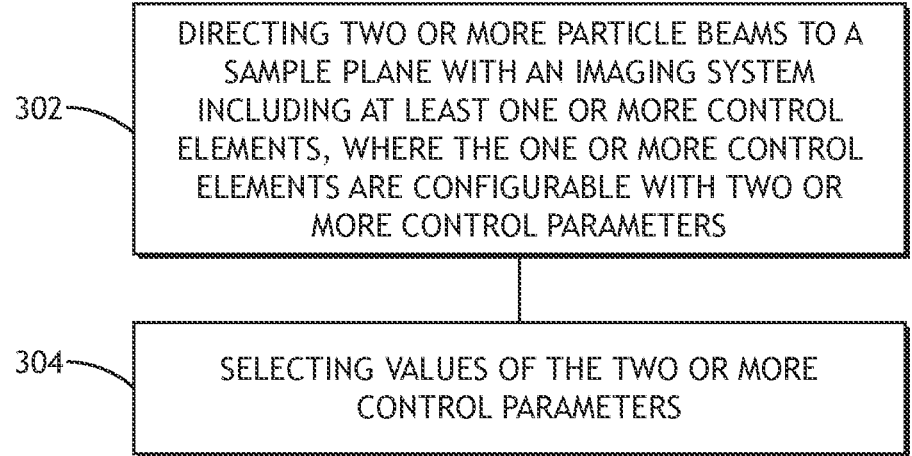
FIG. 3A is a flow diagram illustrating steps performed in a method for controlling distortion of multiple particle beams, in accordance with one or more embodiments of the present disclosure.

FIG. 3A is a flow diagram illustrating steps performed in a method 300 for controlling distortion of multiple particle beams 108, in accordance with one or more embodiments of the present disclosure. The embodiments and enabling technologies described previously herein in the context of the multi-beam imaging system 100 should be interpreted to extend to the method 300. It is further noted, however, that the method 300 is not limited to the architecture of the multi-beam imaging system 100.

In embodiments, the method 300 includes a step 302 of directing two or more particle beams 108 to a sample plane 106 with an imaging system including at least one or more control elements 114, where the one or more control elements 114 are configurable with two or more control parameters. As described with respect to the multi-beam imaging system 100, but not limiting on the method 300, the control parameters may include any type of adjustable setting such as, but not limited to, a position of a control element 114 in any direction, a focusing power of a control element 114, or a current and/or a voltage applied to a control element 114.

In embodiments, the method 300 includes a step 304 of selecting values of the two or more control parameters. FIG. 3B is a flow diagram illustrating a series of steps 306-310 (e.g., sub-steps) for selecting values of the two or more control parameters, in accordance with one or more embodiments of the present disclosure. For example, the steps in FIG. 3B may be performed iteratively until the values of the two or more control parameters converge.

In embodiments, a step 304 of the method 300 includes a step 306 of individually adjusting the two or more control parameters. In embodiments, the method 300 includes a step 308 of measuring changes of distortions of the two or more particle beams 108 resulting from the individual adjustments. In embodiments, the method 300 includes a step 310 of calculating values of the two or more control parameters that reduce the distortions of the two or more particle beams 108 based on the changes of the distortions resulting from the individual adjustments. In embodiments, the method 300 includes a step 312 of adjusting the two or more parameters to the calculated values.

A first iteration of steps 306-312 may begin with initial values of the two or more control parameters, whereas subsequent iterations may begin with values calculated in step 310 and set in step 306 of the previous iteration.

In each iteration, step 306 and step 308 may be repeated for various control parameters. For example, a first control parameter may be adjusted (step 306) and the associated change in distortion of the particle beams 108 may be measured (step 308). The first control parameter may then be returned to its value before the adjustment. This process may then be repeated for a second control parameter, a third control parameter, and so on.

The distortions measured in step 308 may include any type of variation of any of the particle beams 108 from design or ideal conditions. For example, the distortions may be associated with aberrations of any of the particle beams 108 (e.g., defocus, astigmatism, beam shape errors, or the like).

As another example, the distortions may be associated with position deviations of any of the particle beams 108 in the sample plane 106 which may be measured in absolute terms (e.g., relative to a fixed reference) or relative terms (e.g., positions of two or more particle beams 108 relative to each other). As an illustration considering the pattern of particle beams 108 in FIG. 2, a distortion may include an absolute measurement of a position error of a particular particle beam 108a. As another illustration, a distortion may include a relative measurement of a position error of a particular particle beam 108a with respect to one or more adjacent particle beams 108. For instance, such a relative position error may be determined by comparing distances 202 between the particle beam 108a and surrounding particle beams 108.

As another example, the distortions may be associated with magnification and/or rotation errors of a pattern of the particle beams 108 (e.g., as defined by a micro-aperture array 132 and/or a micro-lens array 134 as depicted in FIG. 1B). As another illustration, a distortion may include magnification and/or rotation errors of the pattern depicted in FIG. 2 as a whole.

It is contemplated herein that measurements of individual adjustments of the control parameters in this way may provide a predictive model of the distortion (e.g., a multi-variable predictive model of the distortion) in response to adjustments of the control parameters. Further, such a predictive model may be linear (or assumed to be linear) if the adjustments to the control parameters are sufficiently small. In this approach, the measurements generated in step 308 may be associated with proportionality constants in the linear model.

In embodiments, the step 310 of calculating values of the two or more control parameters that reduce the distortions of the two or more particle beams 108 based on the changes of the distortions resulting from the individual adjustments is performed by generating a predictive model of the distortion in response to adjustments of the control parameters and applying a minimization technique to calculate the values of the control parameters that reduce the distortions. Any suitable minimization technique (or optimization technique more generally) may be utilized. For example, an iterative technique may be used such as, but not limited to, interpolation techniques, pattern-search techniques, direct search techniques, descent techniques, random search techniques, gradient-evaluation techniques, perturbation techniques, or Hessian-based techniques. As another example, a heuristic technique which may not be guaranteed to converge may be used.

The step 312 of adjusting the two or more parameters to the calculated values may be implemented using any suitable technique. In embodiments, the step 312 may include generating control signals (e.g., via the controller 118) to directly adjust the control elements 114 as necessary. In this way, distortion control may be automated. In embodiments, the step 312 may include directing a user to adjust the control elements 114 as necessary (e.g., via the user interface 124 or any suitable technique).

The initial values of the two or more control parameters associated with a first iteration of steps 306-312 may be selected using any suitable technique. For example, the initial values of the control parameters may be arbitrary. As another example, the initial values of the control parameters may be selected by performing initial adjustments to reduce distortions of the particle beams 108. This initial adjustment may be, but is not required to be, performed by a user. It is contemplated herein that providing an initial adjustment of the control parameters to provide at least an initial alignment may reduce a number of iterations of the steps 306-312 required to reach a convergence and/or may prevent runaway conditions in which iterating steps 306-312 does not provide converging values of the control parameters.

The steps 306-312 may be iterated any number of times as part of step 304. In embodiments, the steps 306-312 are iterated until one or more termination conditions are met. For example, the termination conditions may include distortion thresholds (e.g., absolute thresholds). In this way, if the measured distortions of the particle beams 108 are within acceptable distortion thresholds after an iteration, then no further iterations may be necessary. As another example, the termination conditions may include a minimum difference between calculated values from two sequential iterations. As another example, the termination conditions may include a maximum number of iterations.

Referring now generally to FIGS. 3A-3B, the method 300 may be performed multiple times under different conditions.

In embodiments, the method 300 may be performed with a first set of conditions to provide a coarse distortion correction followed by a second set of conditions to provide a fine distortion correction. As an illustration, the first set of conditions may include adjustments of a subset of control parameters of interest and associated measurements (e.g., step 306 and step 308), whereas the second set of conditions may include a full set of control parameters of interest. As another illustration, the first set of conditions may include less stringent termination conditions (e.g., associated with step 304) than the second set of conditions. It is to be further understood that such a technique may be extended beyond coarse and fine distortion corrections and may generally include any number of operations of the method 300 with any conditions.

In embodiments, different iterations of selecting control parameters in step 304 may have different conditions. For example, one or more iterations may include adjustments of a subset of control parameters of interest and associated measurements (e.g., step 306 and step 308), whereas one or more additional iterations may include a full set of control parameters of interest.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
   a controller configured to be coupled to an imaging sub-system utilizing multiple particle beams, wherein the imaging sub-system includes one or more detectors and one or more control elements to manipulate two or more particle beams, wherein the one or more control elements comprise at least one of lenses, rotators, magnifiers, or stigmators, wherein the one or more control elements are adjustable with two or more control parameters, wherein the controller includes one or more processors configured to execute program instructions causing the one or more processors to:

iteratively perform one or more steps until one or more termination conditions are met, wherein the one or more termination conditions include at least one of a distortion threshold, reaching a minimum difference between calculated values from two sequential iterations, or reaching a maximum number of iterations, wherein the one or more steps include:

receive measurements of changes of distortions of the two or more particle beams resulting from individual adjustments of the two or more control parameters from the imaging sub-system, wherein the distortions are associated with at least one of positions or aberrations of the two or more particle beams;

associate the measurements with proportionality constants of a linear predictive model to relate the changes of distortions of the two or more particle beams to the individual adjustments of the two or more control parameters; and calculate values of the two or more control parameters that correspond to at least one of a local minimum or an absolute minimum of the linear predictive model; and provide the calculated values of the two or more control parameters as settings for controlling the imaging sub-system.

2. The system of claim 1, wherein at least one of the one or more control elements comprises:

a multi-pole corrector.

3. The system of claim 2, wherein the multi-pole corrector comprises:

at least one of a quadrupole corrector or a hexapole corrector.

4. The system of claim 1, wherein the two or more control parameters comprise:

at least one of voltages or currents applied to any of the one or more control elements.

5. The system of claim 1, wherein the two or more control parameters comprise:

positions of any of the one or more control elements.

6. The system of claim 1, wherein calculating the values of the two or more control parameters that correspond to at least one of the local minimum or the absolute minimum of the linear predictive model comprises:

calculating the values of the two or more control parameters that correspond to at least one of the local minimum or the absolute minimum of the linear predictive model using at least one of a minimization or an optimization technique.

7. The system of claim 1, wherein providing the calculated values of the two or more control parameters to the calculated values as settings for controlling the imaging sub-system comprises:

generating control signals to adjust the values of the two or more control parameters in the imaging sub-system to the calculated values.

8. The system of claim 1, wherein providing the calculated values of the two or more control parameters to the calculated values as settings for controlling the imaging sub-system comprises:

directing a user to adjust the values of the two or more control parameters to the calculated values.

9. The system of claim 1, wherein the one or more detectors measure emissions by a sample at a sample plane in response to the two or more particle beams, wherein the program instructions are further configured to cause the one or more processors to:

receive data associated with the sample at the sample plane after selecting the values of the two or more control parameters; and generate one or more images based on the received data.

10. A system comprising:

an imaging sub-system utilizing multiple particle beams, wherein the imaging sub-system includes one or more detectors and one or more control elements to manipulate two or more particle beams, wherein the one or more control elements comprise at least one of lenses, rotators, magnifiers, or stigmators, wherein the one or more control elements are adjustable with two or more control parameters; and a controller configured to be coupled to the imaging sub-system, wherein the controller includes one or more processors configured to execute program instructions causing the one or more processors to:

iteratively performing one or more steps until one or more termination conditions are met, wherein the one or more termination conditions include at least one of a distortion threshold, reaching a minimum difference between calculated values from two sequential iterations, or reaching a maximum number of iterations, wherein the one or more steps include:

direct the imaging sub-system to individually adjust the two or more control parameters and receiving measurements of changes of distortions of the two or more particle beams resulting from the individual adjustments, wherein the distortions are associated with at least one of positions or aberrations of the two or more particle beams;

associate the measurements with proportionality constants of a linear predictive model to relate the changes of distortions of the two or more particle beams to the individual adjustments of the two or more control parameters; and calculate values of the two or more control parameters that correspond to at least one of a local minimum or an absolute minimum of the linear predictive model; and adjust settings of the two or more control parameters of the imaging sub-system to the calculated values.

11. The system of claim 10, wherein at least one of the one or more control elements comprises:

a multi-pole corrector.

12. The system of claim 11, wherein the multi-pole corrector comprises:

at least one of a quadrupole corrector or a hexapole corrector.

13. The system of claim 10, wherein the two or more control parameters comprise:

at least one of voltages or currents applied to any of the one or more control elements.

14. The system of claim 10, wherein the two or more control parameters comprise:

positions of any of the one or more control elements.

15. The system of claim 10, wherein calculating the values of the two or more control parameters that correspond to at least one of the local minimum or the absolute minimum of the linear predictive model comprises:

calculating the values of the two or more control parameters that correspond to at least one of the local minimum or the absolute minimum of the linear predictive model using at least one of a minimization or an optimization technique.

16. The system of claim 10, wherein providing the calculated values of the two or more control parameters to the calculated values as settings for controlling the imaging sub-system comprises:

generating control signals to adjust the values of the two or more control parameters in the imaging sub-system to the calculated values.

17. The system of claim 10, wherein providing the calculated values of the two or more control parameters to the calculated values as settings for controlling the imaging sub-system comprises:

directing a user to adjust the values of the two or more control parameters to the calculated values.

18. The system of claim 10, wherein the one or more detectors measure emissions by a sample at a sample plane in response to the two or more particle beams, wherein the program instructions are further configured to cause the one or more processors to:

receive data associated with the sample at the sample plane after selecting the values of the two or more control parameters; and generate one or more images based on the received data.

19. A method comprising:

directing two or more particle beams to a sample plane with an imaging system including one or more detectors and one or more control elements for manipulating the two or more particle beams, wherein the one or more control elements comprise at least one of lenses, rotators, magnifiers, or stigmators, wherein the one or more control elements are configurable with two or more control parameters;

iteratively performing one or more steps until one or more termination conditions are met, wherein the one or more termination conditions include at least one of a distortion threshold, reaching a minimum difference between calculated values from two sequential iterations, or reaching a maximum number of iterations, wherein the one or more steps include:

individually adjusting the two or more control parameters and generating measurements of changes of distortions of the two or more particle beams resulting from the individual adjustments, wherein the distortions are associated with at least one of positions or aberrations of the two or more particle beams;

associating the measurements with proportionality constants of a linear predictive model to relate the changes of distortions of the two or more particle beams to the individual adjustments of the two or more control parameters; and calculating values of the two or more control parameters correspond to at least one of a local minimum or an absolute minimum of the linear predictive model; and adjusting settings of the two or more control elements to the calculated values.

* * * * *